United States Patent
Zhang et al.

(10) Patent No.: US 7,839,173 B1
(45) Date of Patent: Nov. 23, 2010

(54) HIGH SPEED, LOW POWER SIGNAL LEVEL SHIFTER

(75) Inventors: Wenfeng Zhang, San Jose, CA (US); Qi Zhang, Chandler, AZ (US); Jian Tan, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/539,522

(22) Filed: Aug. 11, 2009

(51) Int. Cl.
    *H03K 19/0175* (2006.01)
(52) U.S. Cl. .......................................... 326/81; 326/87
(58) Field of Classification Search ............. 326/80–81, 326/82–83, 86–87; 327/108, 109
    See application file for complete search history.

(56) References Cited

U.S. PATENT DOCUMENTS 5,635,861 A * 6/1997 Chan et al. .................... 326/81
6,252,422 B1 * 6/2001 Patel et al. .................... 326/80
6,842,043 B1   1/2005 Nguyen et al.
6,977,528 B2 * 12/2005 Kang et al. .................. 326/121

* cited by examiner

*Primary Examiner*—James Cho
(74) *Attorney, Agent, or Firm*—Kevin T. Cuenot (57) ABSTRACT

A system for signal level shifting in an IC can include a first inverter having a first pull-up device and a pull-down device, wherein the first inverter is operable to receive an input signal having a voltage potential at a logic high that does not disable the first pull-up device. The system can include a second inverter coupled in series to an output of the first inverter, and a control module coupled to the output of the first inverter and an output of the second inverter. Prior to the input signal transitioning to the logic high, the control module is operable to decouple the input signal from the first pull-up device, disable the first pull-up device, and close a feedback loop that latches an output state of the second inverter.

20 Claims, 5 Drawing Sheets

HIGH SPEED, LOW POWER SIGNAL LEVEL SHIFTER

FIELD OF THE INVENTION

The embodiments disclosed herein relate to semiconductor integrated circuit devices (ICs). More particularly, the embodiments relate to a signal level-shifter for an IC.

BACKGROUND

As device feature size decreases in complimentary metal oxide semiconductor (CMOS) integrated circuit (IC) processes, electric fields generated across junctions within a CMOS device can increase as a power supply voltage provided to the CMOS device remains constant. The same increase in electric field also can occur across oxide layers within CMOS processes, e.g., gate oxides, as oxide layers decrease in thickness. When large enough, electric fields can damage junctions and oxide layers within a CMOS device. Additionally, large electric fields can degrade performance parameters of the CMOS device. To prevent damage to CMOS devices as device feature size is reduced, the maximum voltage potential applied to a CMOS device must be scaled downward. Accordingly, the voltage potential of a power supply provided to an IC with reduced device feature size must be decreased.

Another reason for reducing the voltage potentials of IC power supplies relates to the low power consumption requirements for ICs implemented within battery powered devices. For example, reducing power supply voltages to an IC within a laptop computer can reduce the power consumption of the IC. The reduced power consumption of the IC can extend battery life of the laptop computer.

While reducing the voltage potential of a power supply powering internal IC devices can be beneficial to IC device reliability and power consumption, at the circuit board or system level, the IC still may be coupled to components operating with higher power supply voltages. In that case, the IC may operate with two or more power supplies. Each power supply can provide a different voltage potential to the IC. Typically, one or more low voltage power supplies can be provided to power CMOS devices that drive internal circuits of the IC. One or more high voltage power supplies can be provided to power CMOS devices that receive signals from and/or send signals to, circuits external to the IC. For example, an IC can be provided with a 1.3V power supply for internal circuits and a 3.3V power supply for devices coupled to circuits external to the IC.

Circuits powered by power supplies with differing voltage potentials can output signals with different voltage ranges. For example, one digital circuit powered by a 1.8V power supply can output a signal that varies between 0-1.8V, while another digital circuit powered by a 3.3V power supply may output a signal that varies between 0-3.3V. The difference in signal levels between the two digital circuits can create problems at any interface between the two digital circuits.

For example, consider an interface where a CMOS inverter provides a maximum input voltage of 1.8V to a CMOS inverter operating at 3.3V. The 1.8V input typically cannot disable a pull-up P-type field effect transistor (PFET) device within the CMOS inverter, as −1.5V of gate terminal to source terminal voltage, i.e., 1.8V-3.3V, is being applied to the PFET device. A voltage of −1.5V, however, is sufficient to enable the PFET device. With 1.8V applied to the input of the 3.3V CMOS inverter, both the pull-up PFET device and a pull-down NFET device of the 3.3V CMOS inverter can be enabled simultaneously. In that case, the 3.3V CMOS inverter has an open current path from the 3.3V power supply to ground when receiving a static input high of 1.8V. As such, the 3.3V CMOS inverter unnecessarily consumes power when in a static state.

SUMMARY

The embodiments disclosed within this specification relate to integrated circuit (IC) devices and, more particularly, to signal level shifting within an IC. One embodiment of the present invention can include a system for signal level shifting in an IC. The signal level shifting system can include a first inverter. The first inverter can include a first pull-up device and a pull-down device, wherein the first inverter is operable to receive an input signal having a voltage potential at a logic high that is insufficient to disable the first pull-up device. The system can include a second inverter coupled in series to an output of the first inverter, and a control module coupled to the output of the first inverter and an output of the second inverter. Prior to the input signal transitioning to the logic high, the control module is operable to decouple the input signal from the first pull-up device, disable the first pull-up device, and close a feedback loop that latches an output state of the second inverter.

The control module, responsive to a transition of the input signal from the logic low to the logic high, couples the input signal to the first pull-up device, enables the first pull-up device, and opens the feedback loop.

In one aspect, the control module can include a third inverter, coupled to the output of the first inverter, that receives an output signal from the first inverter, and a second pull-up device, coupled to the output of the first inverter, that receives the output signal from the first inverter. The control module further can include a switch, coupled to an output of the third inverter, that receives an output signal from the third inverter. Responsive to the input signal to the first inverter transitioning to the logic low, the switch decouples the input signal from a gate terminal of the first pull-up device, and the second pull-up device decouples the gate terminal of the first pull-up device from a power supply powering the system. Responsive to the input signal to the first inverter transitioning to the logic high, the switch couples the input signal to the first pull-up device, and the second pull-up device couples the gate terminal of the first pull-up device to the power supply.

In another aspect, the switch can be implemented as an N-type field effect transistor (NFET) device. Accordingly, the switch can include a drain terminal coupled to the gate terminal of the first pull-up device, a source terminal that receives the input signal to the first inverter, and a gate terminal coupled to the output of the third inverter.

In another aspect, the second pull-up device can be implemented as a P-type field effect transistor (PFET) device. Accordingly, the second pull-up device can include a source terminal coupled to the power supply, a drain terminal coupled to the gate terminal of the first pull-up device, and a gate terminal coupled to the output of the second inverter.

In yet another aspect, the second pull-up device can be coupled to the output of the second inverter and receive the output signal from the second inverter. In that case, responsive to the input signal to the first inverter transitioning to the logic low, the second pull-up device can close the feedback loop. The control module further can include a third pull-up device, coupled to the output of the second inverter, that receives the output signal from the second inverter. Responsive to the input signal to the first inverter transitioning to the logic low, the third pull-up device can couple a gate terminal of the first pull-up device to a power supply powering the signal level shifting system. Responsive to the input signal to the first inverter transitioning to the logic high, the second pull-up device opens the feedback loop, and the third pull-up device decouples the gate terminal of the first pull-up device from the power supply.

In a further aspect, the second pull-up device can be implemented as a PFET device. In that case, the second pull-up device can include a source terminal coupled to the power supply, a drain terminal coupled to the output of the first inverter, and a gate terminal coupled to the output of the second inverter.

In still another aspect, the third pull-up device can be implemented as a PFET device. Accordingly, the third pull-up device can include a source terminal coupled to the power supply, a drain terminal coupled to the gate terminal of the first pull-up device, and a gate terminal coupled to the output of the second inverter.

Another embodiment of the present invention can include a system for signal level shifting in a complimentary metal oxide semiconductor (CMOS) IC. The system can include a first inverter. The first inverter can include an output, a first PFET device, and an NFET device, wherein an input signal is coupled to the NFET device and selectively coupled to the first PFET device. The system further can include a second inverter and a control module. The second inverter can include an input and an output, wherein the input of the second inverter is coupled to the output of the first inverter. The control module is coupled to the output of the first inverter and the output of the second inverter. Prior to the input signal transitioning to a logic high, the control module decouples the input signal from the first PFET device, disables the first PFET device, and closes a feedback loop that latches an output state of the second inverter.

The control module, responsive to a transition of the input signal from a logic low to the logic high, couples the input signal to the first PFET device, enables the first PFET device, and opens the feedback loop.

The control module can include a third inverter. The third inverter can be coupled to the output of the first inverter and can include an input and an output. The control module can include an NFET switch. The NFET switch can include a drain terminal coupled to a gate terminal of the first PFET device, a source terminal coupled to receive the input signal, and a gate terminal coupled to the output of the third inverter. Responsive to the input signal transitioning to the logic low, the NFET switch can decouple the input signal from the gate terminal of the first PFET device.

In one aspect, the control module can include a second PFET device. The second PFET device can include a source terminal coupled to a power supply powering the system, a drain terminal coupled to a gate terminal of the first PFET device, and a gate terminal coupled to the output of the second inverter. Responsive to the input signal transitioning to the logic low, the second PFET device can decouple the gate terminal of the first PFET device from the power supply.

In another aspect, the control module can include a second PFET device having a source terminal coupled to a power supply powering the system, a drain terminal coupled to the output of the first inverter, and a gate terminal coupled to the output of the second inverter. In that case, responsive to the input signal transitioning to the logic low, the second PFET device can couple the output of the first inverter to the power supply.

In still another aspect, the control module can include a second PFET device having a source terminal coupled to a power supply powering the signal level shifting system, a drain terminal coupled to a gate terminal of the first PFET device, and a gate terminal coupled to the output of the second inverter. Accordingly, responsive to the input signal transitioning to the logic low, the second PFET device can couple the gate terminal of the first PFET device to the power supply.

Another embodiment of the present invention can include a method of signal level shifting in an IC. The method can include detecting a transition of an input signal, received by a first inverter, from a logic high to a logic low, wherein the first inverter comprises a first pull-up device and an output. The method can include receiving, at a second inverter that includes an input and an output, an output signal generated by the first inverter, wherein the input of the second inverter is coupled to the output of the first inverter. An output signal can be generated at the output of the second inverter. Responsive to detecting the transition of the input signal from the logic high to the logic low, and prior to a subsequent transition of the input signal to the logic high, the input signal can be decoupled from the first pull-up device, the first pull-up device can be disabled, and an output state of the second inverter can be latched.

The method can include detecting a transition of the input signal from the logic low to the logic high. Responsive to detecting the transition of the input signal from the logic low to the logic high, the method can include coupling the input signal to the first pull-up device, enabling the first pull-up device, and unlatching an output state of the second inverter.

Decoupling the input signal from the first pull-up device can include opening a switch that couples the input signal to a gate terminal of the first pull-up device, and enabling a second pull-up device that couples a power supply powering the first inverter to the gate terminal of the first pull-up device.

Disabling the first pull-up device and latching an output state of the second inverter can include enabling a second pull-up device. The enabled second pull-up device couples a power supply powering the first and second inverter to the output of the first inverter. Disabling and latching further can include enabling a third pull-up device, wherein the enabled third pull-up device couples the power supply to a gate terminal of the first pull-up device.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed herein relate to integrated circuit (IC) devices and, more particularly, to signal level shifting within an IC. One embodiment of the present invention can include a system for signal level shifting within a complimentary metal oxide semiconductor (CMOS) IC. The signal level shifting system can receive, from a first circuit, an input signal having a signal level that is insufficient to drive a second circuit. The signal level shifting system can convert the deficient signal level of the input signal to an output signal having a signal level commensurate with proper operation of the second circuit.

The signal level shifting system can include two stages of inverters coupled in series. The first inverter stage can include a pull-up device and a pull-down device. The pull-down device can be coupled to the input signal. The pull-up device can be selectively coupled to receive the input signal via a switch. Prior to a transition of the input signal from a logic low to a logic high, the switch can decouple the input signal from the pull-up device of the first inverter stage. The pull-up device of the first inverter stage can be disabled. Disabling the pull-up device prevents the pull-up device from sourcing current when an input signal logic high to the first inverter is insufficient to disable the pull-up device, yet sufficient to enable the pull-down device.

By disabling the pull-up device, the signal level shifting system can reduce crowbar currents that can occur in conventional signal level shifting systems. In general, crowbar currents occur when pull-up and pull-down devices are enabled simultaneously during a transition of the input signal. Reducing crowbar currents can reduce power consumption by the signal level shifting system. Subsequent to the input signal transitioning from a logic low to a logic high, the signal level shifting system can enable the pull-up device, and close the switch, thereby coupling the input signal to the pull-up device. Operated in this manner, the signal level shifting system can increase a signal level while averting simultaneous enablement of pull-up and pull-down devices at steady state conditions.

Figure 1:
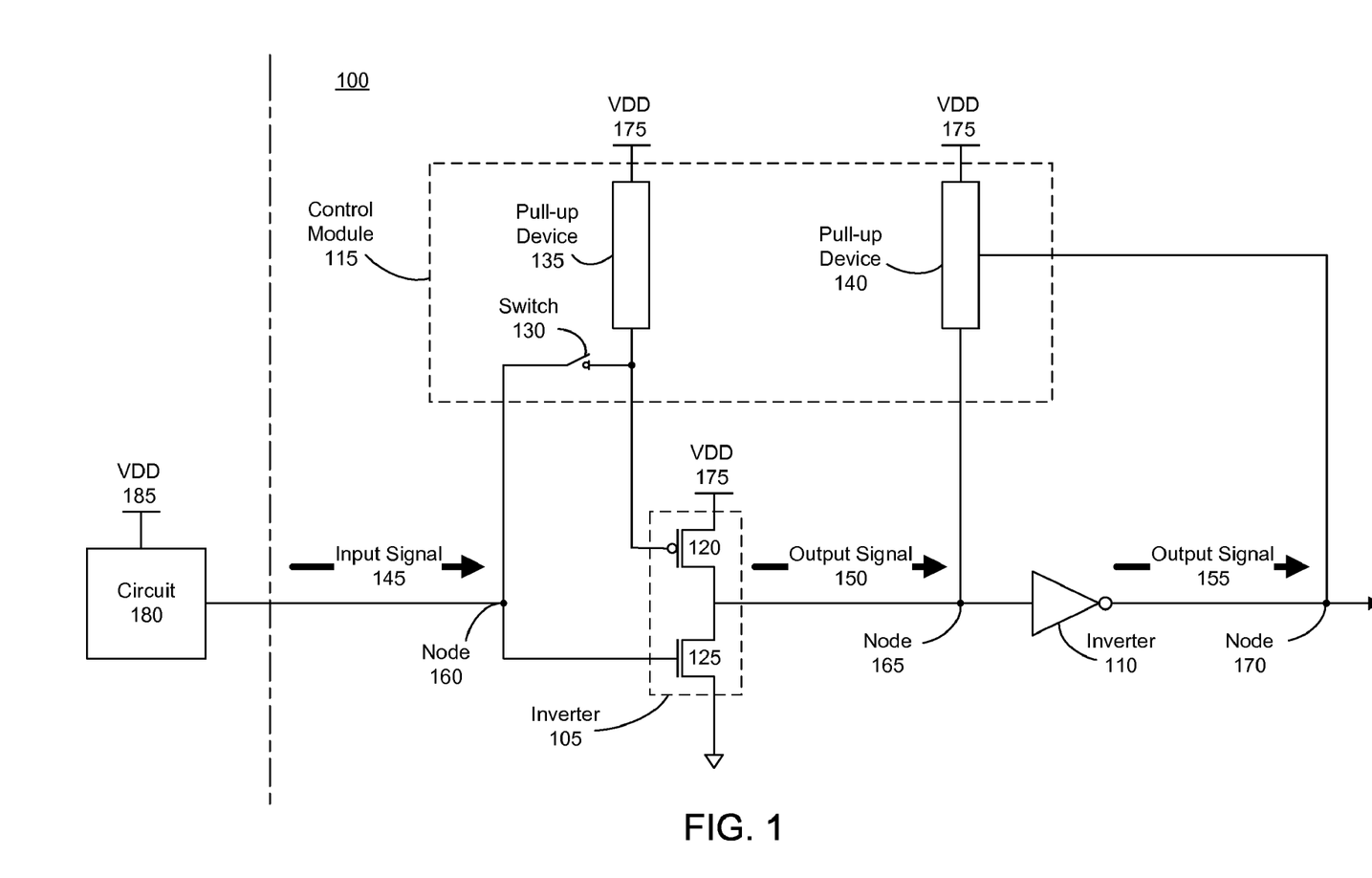
FIG. 1 is a first schematic diagram illustrating a signal level shifting system for use within an integrated circuit (IC) in accordance with one embodiment of the present invention.

FIG. 1 is a first schematic diagram illustrating a signal level shifting (level shifting) system 100 in accordance with one embodiment of the present invention. Level shifting system 100 can receive an input signal with a first voltage range and increase the signal level to a second, wider voltage range. Level shifting system 100 can include a first inverter 105, a second inverter 110, and a control module 115.

Inverter 105 can include a P-type field effect transistor (PFET) 120 and an N-type field effect transistor (NFET) 125. PFET 120 can operate as a pull-up device within inverter 105 that, when enabled, sources current to node 165. NFET 125 can operate as a pull-down device within inverter 105 that, when enabled, sinks current from node 165. Node 165 corresponds to the output of inverter 105. As used within this specification, a "pull-up" or "pull-down" device refers to a transistor that can functionally operate as a switch and, when enabled, couple a selected node of a circuit at a predetermined voltage potential to a target node of the circuit. Depending upon the relative voltage differential between the selected node and the target node, the transistor can be classified as a pull-up or a pull-down type of device. A pull-up device can source current to pull up the voltage potential at the target node. A pull-down device can sink current to pull down the voltage at the target node.

Additionally, as used within this specification, the term "couple" refers to an electrical connection between two or more nodes that allows the exchange of an electrical property, such as a voltage, a current, or a signal, between the nodes. For example, the output of a first inverter can be coupled to the input of a second inverter allowing an output signal of the first inverter to be received as an input signal by the second inverter. The closing of a switch between two nodes can be said to "couple" the two nodes together, thereby allowing current to flow between the two nodes. In another example, the enabling of a CMOS device can create a current path from the source terminal of the CMOS device through the body of the CMOS device to the drain terminal of the CMOS device, thereby coupling a node at the source terminal to a node at the drain terminal. Throughout this specification, it is assumed that a node at a drain terminal of a CMOS device and a node at a source terminal of the CMOS are considered coupled when the CMOS device is enabled, and decoupled when the CMOS device is disabled.

Inverter 105 can receive an input signal 145 from an output stage of a circuit 180 at node 160. VDD 185 is a power supply powering circuit 180. Node 160 corresponds to the output of circuit 180 and the input of inverter 105. A source terminal of PFET 120 is coupled to VDD 175. VDD 175 can represent a power supply providing power to level shifting system 100. VDD 185 can be a power supply with a voltage potential less than VDD 175. As such, a signal voltage range of circuit 180, e.g., input signal 145, can be less than a signal voltage range of circuits within level shifting system 100. A drain terminal of PFET 120 is coupled to a drain terminal of NFET 125 at node 165. A source terminal of NFET 125 is coupled to ground. Output signal 150 can be generated at node 165 by inverter 105. Node 165, being the output of inverter 105, is coupled to the input of inverter 110 and a first input of control module 115.

Inverter 110 can include an output, corresponding to node 170. As pictured, node 170 is coupled to a second input of control module 115. Inverter 110 can receive output signal 150 from inverter 105. Responsive to receiving output signal 150, inverter 110 can generate output signal 155 at node 170.

Control module 115 can include a switch 130, a pull-up device 135, and a pull-up device 140. Control module 115 can receive output signal 150 and output signal 155 as control signals that enable and disable various functional blocks of control module 115. The functionality of control module 115 can change responsive to logic level transitions that occur within input signal 145 and correspondingly within output signals 150 and 155. Switch 130 is a functional representation of a device that, when closed, couples input signal 145 to the gate terminal of PFET 120. When enabled, pull-up device 135 couples the gate terminal of PFET 120 to VDD 175, thereby disabling PFET 120.

When enabled, i.e., closed, pull-up device 140 functions as a switch that completes a positive feedback loop. The positive feedback loop begins at node 165, continues through inverter 110 to pull-up device 140, and returns to node 165. Practically, pull-up device 140 functions as a pull-up device that couples node 165 to VDD 175. Unlike pull-up device 135 that, when enabled, opens a feedback path by disabling PFET 120, enabling pull-up device 140 closes a feedback path. As such, enabling pull-up device 140 creates a positive feedback loop that latches an output state of inverter 110.

In operation, inverter 105 of level shifting system 100 can increase a signal voltage range at an interface between two circuits, wherein each of the two circuits operates with a different power supply. Each power supply can provide a different voltage range. A "voltage range," as used within this specification, refers to a voltage differential between a highest and a lowest voltage potential provided by a signal or power supply of a circuit. For example, an input signal that has a logic high of 2V and a logic low of 1V has a voltage range between 1 and 2 volts. With the two different circuits operating at two different voltage potentials, the signal range of each of the two circuits can differ. Accordingly, a voltage potential of a logic high for each of the two circuits can differ. For example, a voltage potential of a logic high for input signal 145 can be 1.2V. Assuming that the voltage potential of VDD 175 is 2.7V, a voltage potential for a logic high at the output of inverter 105 is approximately 2.7V. As such, a signal voltage range of inverter 105 differs from a signal voltage range of the circuit providing input signal 145.

Throughout this specification, signals are described in terms of logic levels, e.g., a logic high or a logic low, where the difference between logic high and logic low represents a full output voltage range of a circuit. In general, the voltage potential associated with logic high and logic low is approximately equal to the voltage potential of each associated supply rail powering the circuit. As used within this specification, the phrase "supply rail," refers to a highest or a lowest voltage potential supplying power to a circuit. The lowest and highest voltage potentials to the circuit can be provided by a power supply coupled to an IC within which the circuit is implemented.

Many digital circuits, and some analog circuits, require an input signal with a voltage range approximately equal to a voltage range of a power supply powering the circuit. Assuring the voltage potential of a logic level of an input signal to a digital circuit is approximately equal to an associated supply rail of the digital circuit ensures that only one of either a pull-up device(s) or a pull-down device(s) of the circuit is enabled when the circuit is at a particular input logic level.

For example, consider the case of a conventional CMOS inverter, including a PFET pull-up device and an NFET pull-down device, that is powered by supply rails at ground and 3V. An input signal with a voltage range between 0V and 1.7V can be provided to the CMOS inverter. The input signal at a logic high, with a voltage potential of 1.7V, can be applied to an input of the CMOS inverter. With the 1.7V input, the NFET device of the inverter has a gate terminal to source terminal voltage differential, denoted as $V_{gs}$, of 1.7V. The PFET device of the inverter can have a $V_{gs}$ of −1.3V, i.e., 1.7V-3.0V. In that case, both the PFET device and the NFET device are enabled simultaneously, as the devices typically are enabled at −0.7V and 0.7V respectively. With both the PFET and NFET devices enabled, a direct current path from the 3V supply rail to ground is created. The direct current path can result in static power consumption by the CMOS inverter in response to a logic high input signal. The resulting static power consumption creates a condition that is contrary to an advantageous feature of digital circuits, i.e., low static power consumption.

Conventional level shifting circuits based upon differential input signals can experience similar power consumption issues. Conventional level shifting circuits typically leverage a differential input to single ended output conversion to level shift a logic high input signal at a voltage potential less then the high supply rail of the conventional level shifting circuit. The output of the differential to single ended conversion stage can include a pull-up device and a pull-down device in series across the supply rails of the conventional level shifting circuit.

At the midpoint of a transition of logic states of an input signal to a conventional level shifting circuit, e.g., from a logic low to a logic high, both the pull-down and the pull-up devices at the output of the differential to single ended conversion stage are simultaneously enabled. When simultaneously enabled, the pull-up and pull-down devices are in contention for control of the voltage at the output of the differential to single ended conversion stage. Contention can be exacerbated by positive feedback loops within conventional level shifting circuits that serve to latch the output state of the conventional level shifting circuit in response to a static input signal.

A contention condition between pull-up and pull-down devices during an input signal transition creates switching delays in the output of conventional level shifting circuits. Additionally, when in contention, the simultaneously enabled pull-up and pull-down devices create an open current path across the supply rails. The current created by contention is known in the art as "crowbar current." The more severe the contention between the pull-up and pull-down devices, the larger the quantity of the crowbar current generated during the input signal transition.

To avoid contention and crowbar current issues, the input stage of level shifting system 100 is implemented as inverter 105. It should be noted that inverter 105 contains no positive feedback loops which may contend with an input signal for control of a voltage potential at the input or output of a circuit containing positive feedback loops. Accordingly, the enabling of the pull-up device, i.e., PFET 120, and the pull-down device, i.e., NFET 125, within inverter 105 is controlled by input signal 145 and the functional mode of control module 115. The lack of positive feedback loops within inverter 105 increases the speed of level shifting system 100. The lack of positive feedback within inverter 105 further decreases the quantity of crowbar current within level shifting system 100.

Referring to FIG. 1, prior to a transition of input signal 145 from a logic high to a logic low, control module 115 can be in a high operation mode. High operation mode refers to an operational state in which level shifting circuit 100 has reached steady state with respect to input signal 145 being at a logic high. In high operation mode, control module 115 disables pull-up devices 135 and 140, and closes switch 130. In high operation mode, input signal 145 is coupled to the gate terminals of PFET 120 and NFET 125. In high operation mode, inverter 105 operates as a conventional CMOS inverter. As input signal 145 transitions to a logic low, PFET 120 is enabled and NFET 125 is disabled. PFET 120, being enabled, can sink current to node 165 until the voltage potential of output signal 150 is approximately equal to the voltage potential of power supply VDD 175. As such, output signal 150 has transitioned to a logic high.

When output signal 150 is at a logic high, output signal 155 transitions to a logic low. The transition of output signals 150 and 155 switches control module 115 to a low operation mode. Low operation mode refers to an operational state in which level shifting circuit 100 has reached steady state with respect to input signal 145 being at a logic low. In low operation mode, control module 115 can open switch 130, thereby decoupling input signal 145 from the gate terminal of PFET 120.

Control module 115 also can enable pull-up device 135, thereby coupling the gate terminal of PFET 120 to VDD 175. Coupling VDD 175 to the gate terminal of PFET 120 applies VDD 175 to both the gate and source terminals of PFET 120.

With both the gate and source terminals of PFET 120 coupled to VDD 175, the $V_{gs}$ of PFET 120 is approximately zero, thereby disabling PFET 120. Additionally, control module 115 can enable pull-up device 140, thereby closing a positive feedback loop from node 165 through inverter 110 to node 170, continuing through pull-up device 140 and returning to node 165. The positive feedback loop latches the output state of inverter 110 at a logic low.

It should be noted that at the beginning of the transition of input signal 145 from a logic high to a logic low, the gate terminal of PFET 120 is coupled to input signal 145 and the voltage potential at the gate terminal tracks input signal 145 as input signal 145 transitions to a logic low. Upon input signal 145 achieving the logic low state, inverter 105 switches state and output signal 150 becomes a logic high. With output signal 150 at a logic high, control module 115, being in low operation mode, decouples input signal 145 from the gate terminal of PFET 120. Accordingly, the voltage potential at the gate terminal of PFET 120 ceases to track input signal 145.

In addition, control module 115 couples VDD 175 to the gate terminal of PFET 120, thereby increasing the voltage potential at the gate terminal from a logic low to approximately VDD 175. With the voltage potential of the gate terminal PFET 120 at VDD 175, PFET 120 is disabled. Thus, at the beginning of the transition of input signal 145 from a logic high to a logic low, PFET 120 is enabled and coupled to input signal 145, and at a time subsequent to the transition of input signal 145 from a logic high to a logic low, PFET 120 is disabled and decoupled from input signal 145. The period of time between the transitioning of input signal 145 from a logic high to a logic low to the disabling of PFET 120 is a function of the signal propagation delay from the input of inverter 105, through inverter 110, to control module 115, and back to the gate terminal of PFET 120.

For proper operation of level shifting circuit 100, the disabling of PFET 120 must occur prior to input signal 145 transitioning back to a logic high from a logic low. In one embodiment, in order to ensure that PFET 120 is disabled prior to the transition of input signal 145 from a logic low to a logic high, the time delay of the signal path from the input of inverter 105, through inverter 110, to pull-up device 135, and back to the gate of PFET 120 when PFET 120 is disabled, is less than the time period between the transitioning of input signal 145 to a logic low and the transitioning of the of input signal 145 to a logic high. As the voltage potential of a logic high for input signal 145 is less than the voltage potential of VDD 175, input signal 145 can enable both PFET 120 and NFET 125. Disabling PFET 120 prior to input signal 145 transitioning to a logic high prevents PFET 120 and NFET 125 from being simultaneously enabled during the transition. With PFET 120 disabled, no contention exists between NFET 125 and PFET 120 for control of the voltage potential at node 160 when input signal 145 transitions from a logic low to a logic high. Additionally, the generation of crowbar current during the transition of input signal 145 is prevented as PFET 120 and NFET 125 are not simultaneously enabled. Accordingly, within inverter 105, a direct current path from VDD 175 to ground does not occur.

Subsequent to input signal 145 transitioning to a logic high, output signals 150 and 155 can transition to a logic low and a logic high, respectively. The transitions of output signals 150 and 155 cause control module 115 to enter high operation mode. In high operation mode, input signal 145 is again coupled to the gate terminal of PFET 120 and pull-up devices 135 and 140 are disabled. With pull-up device 140 disabled, the positive feedback loop that latches the output state of inverter 110 is opened. In high operation mode, level shifting system 100 is prepared for a next transition of input signal 145 from a logic high to a logic low.

Figure 2:
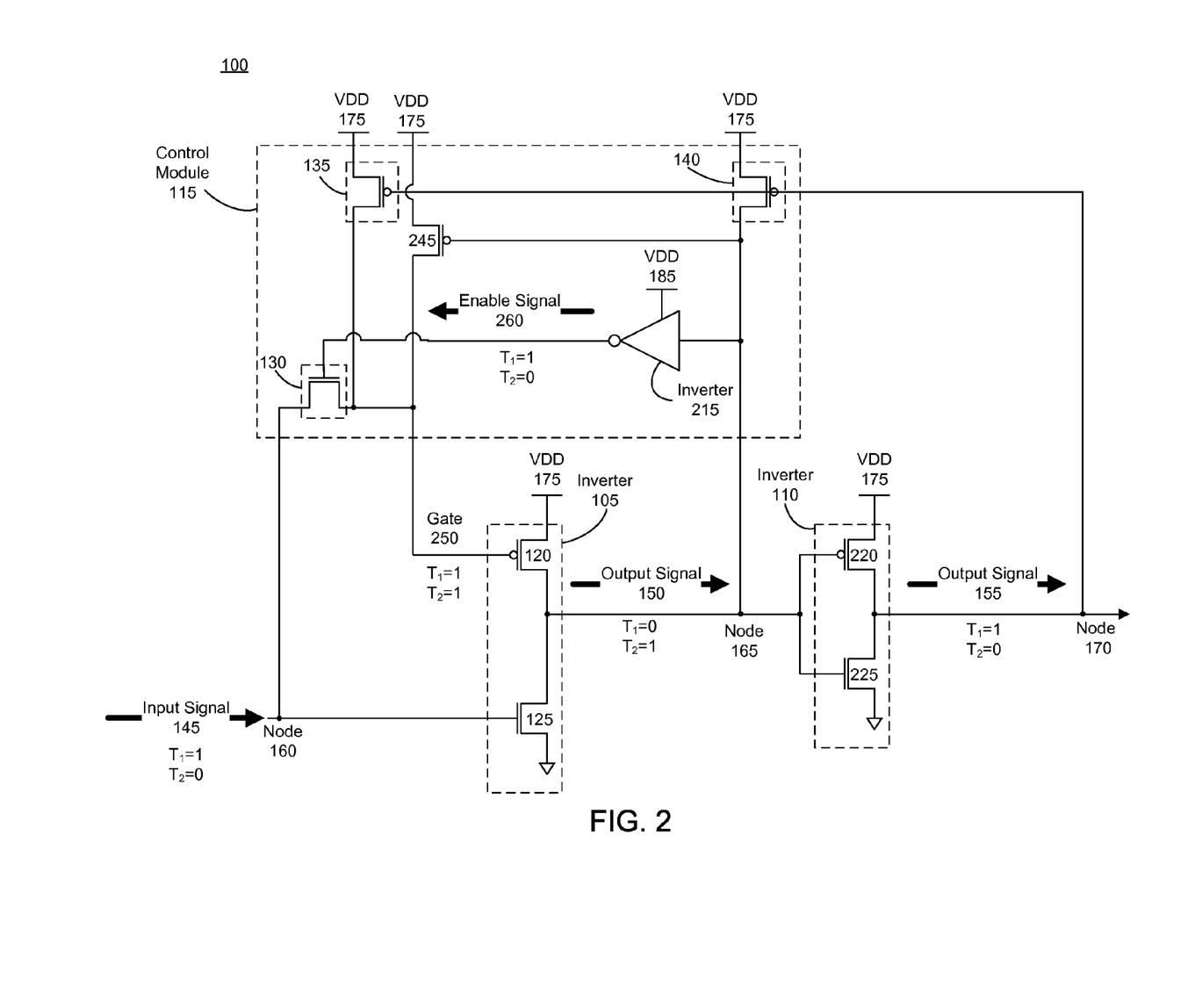
FIG. 2 is a second schematic diagram illustrating the signal level shifting system of FIG. 1 in accordance with another embodiment of the present invention.

FIG. 2 is a second schematic diagram illustrating the signal level shifting system 100 of FIG. 1 in accordance with another embodiment of the present invention. FIG. 2 illustrates a more detailed view of signal level shifting system 100. As such, like numbers are used to refer to the same items throughout this specification. As shown, level shifting system 100 can include an inverter 105, an inverter 110, and control module 115.

Inverter 110 can include PFET 220 and NFET 225. PFET 220 can operate as a pull-up device within inverter 110. NFET 225 can operate as a pull-down device within inverter 110. Inverter 110 can receive output signal 150 from inverter 105. The gate terminals of PFET 220 and NFET 225 are coupled together at node 165. The source terminal of PFET 220 is coupled to VDD 175. The drain terminals of PFET 220 and NFET 225 are coupled together at node 170. The source terminal of NFET 225 is coupled to ground. Output signal 155 is generated by inverter 110 at node 170.

As pictured in FIG. 2, control module 115 includes an inverter 215 and a pull-up device 245. For purposes of clarity, neither inverter 215 nor pull-up device 245 was independently illustrated in FIG. 1. Inverter 215 can be implemented as a CMOS inverter. As shown, inverter 215 receives power from VDD 185. An input of inverter 215 is coupled to node 165 to receive output signal 150. An output signal of inverter 215 is represented by, or corresponds to, enable signal 260.

Typically, CMOS devices within a circuit, e.g. circuit 180 of FIG. 1, cannot be safely operated at a voltage potential significantly greater than a power supply provided to the circuit. As circuit 180 (not shown in FIG. 2), which provides input signal 145, operates with a lower voltage power supply, for example VDD 185, voltages significantly greater than VDD 185 may damage devices within circuit 180. When switch 130 is enabled and enable signal 260 is coupled to the gate terminal of switch 130, the maximum voltage at a device within circuit 180 (e.g., a device coupled to node 160) is the voltage of the power supply powering inverter 215–$V_{gs}$ of switch 130, when enabled. For this reason, the voltage potential provided to inverter 215 may need to be less than VDD 175 to ensure that damaging voltage potentials are not applied to devices within circuit 180 when switch 130 is enabled.

Switch 130, within control module 115, is enabled when enable signal 260 is at a logic high. Switch 130 is disabled when enable signal 260 is at a logic low. Switch 130 can be implemented as an NFET device with a source terminal coupled to input signal 145 and a drain terminal is coupled to gate 250 of PFET 120. When enabled, switch 130 can close, thereby coupling input signal 145 to gate 250 of PFET 120.

Pull-up device 135 can be implemented as a PFET device. The source terminal of pull-up device 135 is coupled to VDD 175. The drain terminal of pull-up device 135 is coupled to gate 250 of PFET 120. The gate terminal of pull-up device 135 is coupled to node 170 and receives output signal 155 as a control signal. When output signal 155 is at a logic high, pull-up device 135 can be disabled. When output signal 155 is at a logic low, pull-up device 135 can be enabled, thereby sinking current until the voltage at gate 250 increases to approximately VDD 175.

Pull-up device 140 can be implemented as a PFET device. The source terminal of pull-up device 140 is coupled to VDD 175. The drain terminal of pull-up device 140 is coupled to node 165. The gate terminal of pull-up device 140 is coupled to node 170 and receives output signal 155 as a control signal. When output signal 155 is at a logic high, pull-up device 140 can be disabled. When output signal 155 is at a logic low, pull-up device 140 can be enabled, thereby sinking current until the voltage at node 165 increases to approximately VDD 175. When enabled, pull-up device 140 closes a positive feedback loop from node 165, through inverter 110, to pull-up device 140, and returning to node 165.

Pull-up device 245 can be implemented as a PFET device. The source terminal of pull-up device 245 is coupled to VDD 175. The drain terminal of pull-up device 245 is coupled to gate 250 of PFET 120. The gate terminal of pull-up device 245 is coupled to node 165 and can receive output signal 150 as a control signal. When output signal 150 is at a logic high, pull-up device 245 can be disabled. When output signal 150 is at a logic low, pull-up device 245 can be enabled, thereby sinking current until a voltage at gate 250 increases to approximately VDD 175.

In operation, level shifting system 100 begins at time $T_1$ with the input signal 145 at a logic high, as illustrated in FIG. 2. At time $T_1$, for descriptive purposes, it is assumed that input signal 145 has been at a logic high for a sufficient period of time to allow all signals within level shifting system 100 to settle and reach steady state values. Level shifting system 100 can increase the signal level at the interface between two circuits with differing signal voltage ranges. As such, a logic high signal level for input signal 145 can be a voltage potential less than the voltage potential of VDD 175, e.g., VDD 185, thus necessitating the need for level shifting system 100.

It should be noted that in order ensure proper operation of level shifting system 100, as illustrated in FIG. 2, each of the two circuits to be interfaced by level shifting system 100 requires a common lower supply rail. The common lower supply rail can be ground or another common lower voltage potential supplying the IC. Without a common lower supply rail, NFET 125 of inverter 105 may be enabled when input signal 145 is at a static logic low.

At time $T_1$, input signal 145 is at a logic high with a voltage potential of approximately VDD 185. As noted within this specification, the voltage potential of VDD 185 is less than the voltage potential of VDD 175. Accordingly, output signal 150 is at a logic low at $T_1$. As inverter 110 receives a logic low input, output signal 155 at $T_1$ is at a logic high with a voltage potential of approximately VDD 175. With output signal 155 at a logic high, both of pull-up devices 135 and 140 are disabled. With output signal 150 at a logic low, pull-up device 245 and switch 130 can be enabled. With switch 130 enabled, input signal 145 is coupled to PFET 120.

With switch 130 and pull-up device 245 enabled, current flows from VDD 175 through pull-up device 245 and switch 130 to a source of input signal 145. Although at $T_1$ input signal 145 is at a logic high, the voltage potential of input signal 145 when at a logic high is less than VDD 175. The difference in voltage potential between input signal 145 and VDD 175 at $T_1$ induces a current flow from VDD 175 to the source of input signal 145, for example, circuit 180 in FIG. 1. For this reason, in one embodiment, pull-up device 245 can be implemented as a "weak" device by comparison to other pull-up devices within level shifting circuit 100. As used within this specification, the phrase "weak device," refers to a CMOS device implemented with a low width to length (W/L) ratio, thereby reducing the current driving capability of pull-up device 245 and increasing the "on" resistance, denoted as $R_{on}$, of pull-up device 245. Increasing $R_{on}$ and decreasing the current driving capability of pull-up device 245 can reduce static current flow through pull-up device 245 and switch 130 when both are enabled.

At time $T_2$, input signal 145 has transitioned from a logic high to a logic low. With switch 130 enabled, as input signal 145 transitions to a logic low, NFET 125 is disabled, and PFET 120 is enabled. When enabled, PFET 120 can source current to node 165 of inverter 105, thereby causing output signal 150 to transition to a logic high. With output signal 150 at a logic high, output signal 155 transitions to a logic low. Additionally, with output signal 150 at a logic high, pull-up device 245 is disabled.

With output signal 155 at a logic low, pull-up devices 135 and 140 are enabled. When enabled, pull-up device 140 sources current to node 165, thereby latching output signal 150 at approximately VDD 175. Enabling pull-up device 140 can effectively latch a logic high state at output signal 150 and a logic low state at output signal 155. Further, with output signal 150 at a logic high, enable signal 260 can transition to a logic low. Enable signal 260, being at a logic low, disables switch 130, thereby decoupling input signal 145 from gate 250 of PFET 120. As pull-up device 135 is enabled, pull-up device 135 can source current to gate 250. Accordingly, pull-up device 135 can hold the voltage potential at gate 250 to approximately VDD 175. With voltage potential of gate 250 at approximately VDD 175, PFET 120 is disabled, thereby preventing PFET 120 from functioning as a pull-up device within inverter 105.

Figure 3:
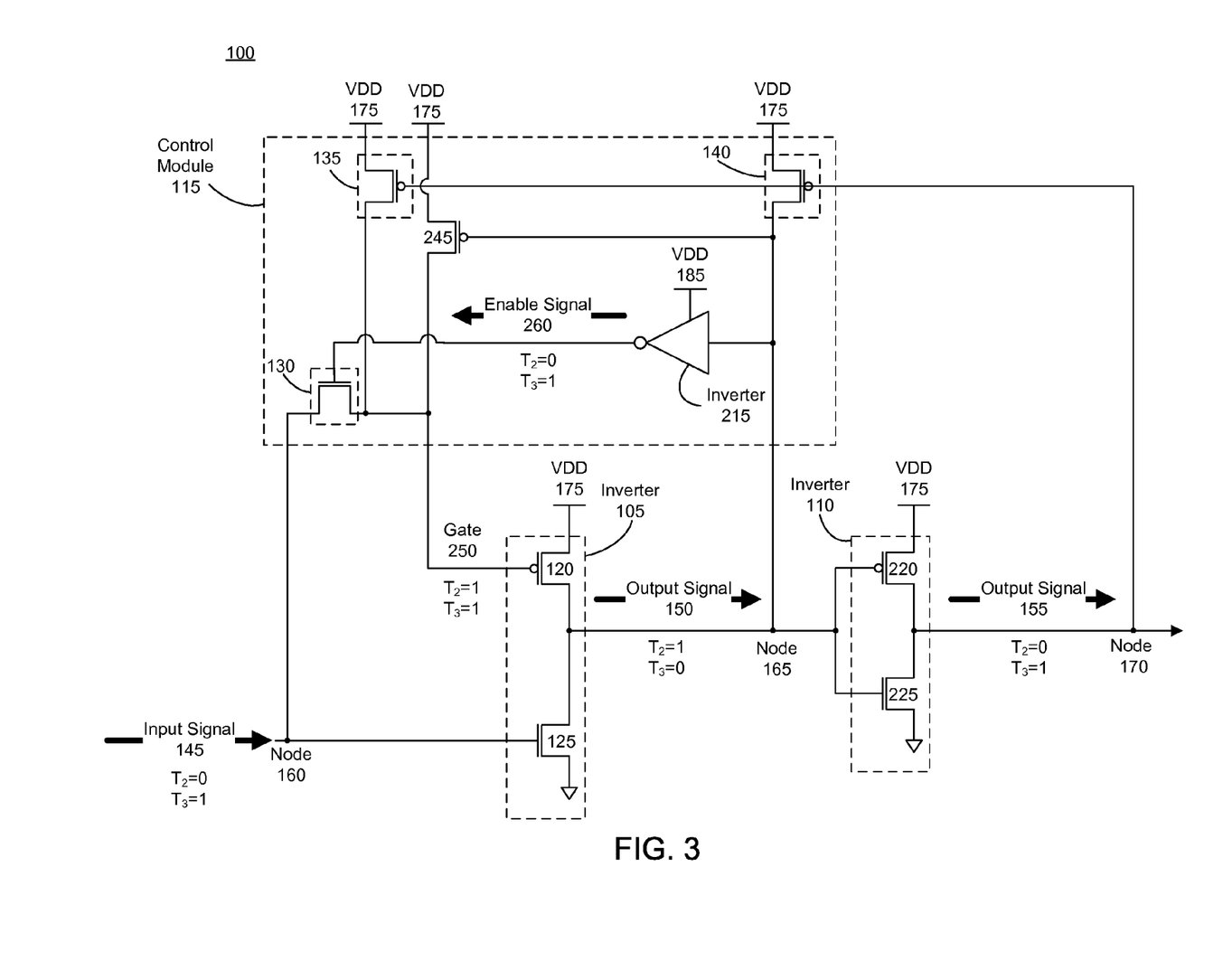
FIG. 3 is a third schematic diagram illustrating the signal level shifting system of FIG. 1 in accordance with another embodiment of the present invention.

FIG. 3 is a third schematic diagram illustrating the level shifting system 100 of FIG. 2 in accordance with another embodiment of the present invention. FIG. 3 illustrates a case where the input signal to the level shifting system 100 transitions from a logic low to a logic high. The circuit conditions described in FIG. 3 begin at $T_2$ with the steady state values achieved for level shifting system 100 at the end of the description of FIG. 2.

Beginning at $T_2$, switch 130 can be open and pull-up device 245 can be disabled. PFET 235 can be enabled and gate 250 can be at a logic high, thereby disabling PFET 120. As input signal 145 transitions from a logic low to a logic high NFET 125 is enabled. In a typical inverter, as the voltage potential of a logic high for input signal 145 is less than VDD 175, it is not assured that PFET 120 is disabled as NFET 125 is enabled. For example, VDD 175 can be equal to 2.5V and input signal 145 can be equal to 1.2V when at a logic high. With the gate terminal of PFET 120 at 1.2V and the source terminal at 2.5V, $V_{gs}$ for PFET 120 is −1.3V. In addition, $V_{gs}$ for NFET 125 is 1.2V. In a typical CMOS process, the preceding conditions would simultaneously enable both PFET 120 and NFET 125. This condition would place both PFET 120 and NFET 125 in contention for control of the voltage at node 165.

By disabling PFET 120 before the transition of input signal 145 from a logic low to a logic high at $T_3$, level shifting system 100 can avoid contention conditions between PFET 120 and NFET 125, and the associated crowbar current that occurs in conventional level shifting circuits. In addition, the removal of the contention condition between PFET 120 and NFET 125 can reduce signal delay and increase the switching speed of level shifting system 100.

Subsequent to the transition of input signal 145 from a logic low to a logic high, corresponding to approximately time $T_3$, output signal 150 transitions from a logic high to a logic low. With output signal 150 being at a logic low, pull-up device 245 is enabled and enable signal 260 transitions from a logic low to a logic high. With enable signal 260 at a logic high, switch 130 is enabled and input signal 145 is coupled to the gate 250 of PFET 120.

Returning to output signal 150, the transition of output signal 150 from a logic high to a logic low causes output signal 155 to transition from a logic low to a logic high. With output signal 155 at a logic high, PFETs 135 and 240 are disabled until the next transition of input signal 145.

Figure 4:
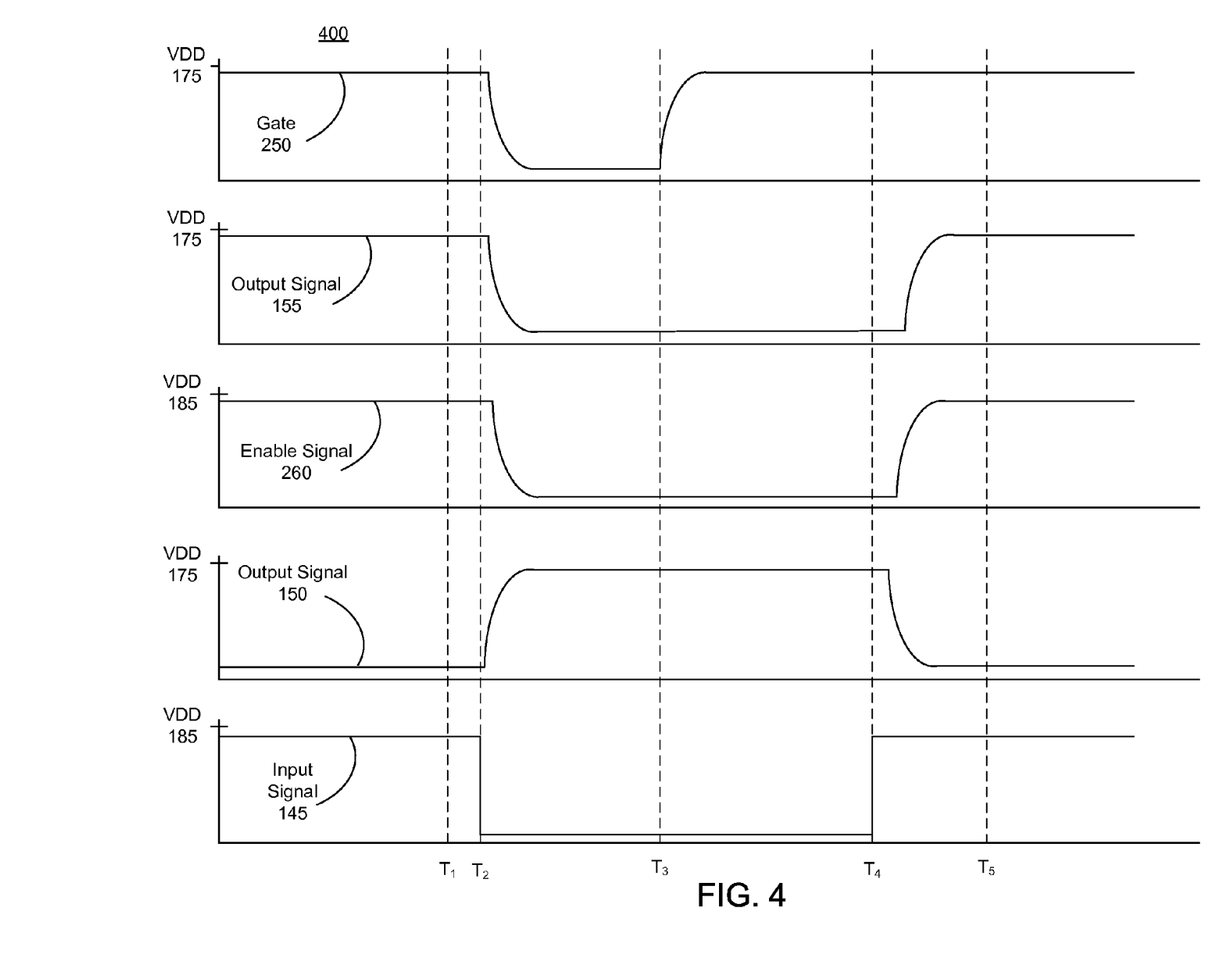
FIG. 4 shows a series of graphs illustrating exemplary signal changes at various nodes of a signal level shifting system as described with reference to FIGS. 1-3 in accordance with another embodiment of the present invention.

FIG. 4 shows a series of graphs illustrating signal changes at various nodes of a level shifting system as described with respect to FIGS. 1-3 for use within an IC in accordance with another embodiment of the present invention. More particularly, FIG. 4 illustrates the manner in which signals vary within a level shifting system in response to a transition of an input signal to the level shifting system. In describing signal changes seen within FIG. 4, reference is made to corresponding signals, nodes, and/or circuit structures as represented within level shifting system 100 illustrated in FIGS. 1-3. Within FIG. 4, each vertical axis represents voltage and each horizontal axis represents time.

At time $T_1$, the level shifting system 100 can be in steady state. No signal in FIG. 4 is transitioning between logic levels. At $T_1$, input signal 145 is at a logic high approximately equal to VDD 185 and output signal 150 is at a logic low. Each of enable signal 260, output signal 155, and a voltage at gate 250 is at a logic high. It should be noted that the signal voltage range of input signal 145, being the signal to be level shifted, and enable signal 260 are less than the other signals represented in graph 400. For example, input signal 145 and enable signal 260 can have a voltage range of approximately 1 volt corresponding to VDD 185, while the other signals illustrated in FIG. 4 have a voltage range of approximately 2.5 volts corresponding to VDD 175. When enable signal 260 is at a logic high, switch 130 is enabled and input signal 145 is coupled to gate 250 of PFET 120. In this mode, inverter 105 functions as a conventional inverter.

At time $T_2$, input signal 145 transitions from a logic high to a logic low. As known to one skilled in the art, all circuits have a finite delay between an input to a circuit and an output from the circuit. As such, although input signal 145 transitions at time $T_2$, each other signal within graph 400 transitions at some time subsequent to the transition of input signal 145 depending upon the quantity of delay within level shifting system 100. The same effect occurs at the transition of input signal 145 at time $T_4$.

Continuing at time $T_2$, as switch 130 is enabled and gate 250 is coupled to input signal 145, the voltage potential at gate 250 tracks the voltage potential of input signal 145 and transitions to a logic low. Additionally, output signal 150, being the output of inverter 105, transitions to a logic high as input signal 145 transitions to a logic low. The transition of output signal 150 to a logic low causes inverter 110 to switch states, thereby transitioning output signal 155 from a logic high to a logic low. The transition of output signal 150, further, causes inverter 215 to switch states, thereby transitioning enable signal 260 from a logic high to a logic low. With enable signal 260 at a logic low, switch 130 is disabled.

In addition, the transition of output signal 150 from a logic low to a logic high can disable pull-up device 245. Disabling pull-up device 245 and switch 130 creates a floating node at gate 250. To prevent gate 250 from floating, as output signal 155 transitions to a logic low, pull-up device 135 is enabled, thereby holding the voltage potential at gate 250 at approximately VDD 175. In addition, the transition of output signal 155 to a logic low enables pull-up device 140, thereby latching output signal 155 at a logic low.

At time $T_3$, the effects on the voltage at gate 250 of pull-up device 135 being enabled can be seen in the voltage signal at gate 250. The time between $T_2$ and $T_3$ represents the delay time of the signal feedback path from the input of inverter 105 through inverter 110, to pull-up device 135 and back to gate 250. Subsequent to time $T_3$, the voltage at gate 250 pulls up to approximately VDD 175. With the voltage at gate 250 at approximately VDD 175, PFET 120 of inverter 105 can be disabled. Disabling PFET 120 prior to the transition of input signal 145 from a logic low to a logic high prevents a contention condition from occurring between PFET 120 and NFET 125 as inverter 105 switches state.

At time $T_4$, with PFET 120 disabled, input signal 145 can transition from a logic low to a logic high. As input signal 145 transitions to a logic high, NFET 125 can be enabled and output signal 150 can transition to a logic low. Accordingly, as output signal 150 transitions to a logic low, enable signal 260 can transition to a logic high, thereby enabling switch 130. In addition, the transition of output signal 150 to a logic low enables pull-up device 245.

The transition of output signal 150 to a logic low can switch the logic state of inverter 110, thereby transitioning output signal 155 to a logic high. With output signal 155 at a logic high, both pull-up devices 135 and 140 are disabled. The disabling of pull-up device 140 opens the positive feedback loop that latches the output state of inverter 110. At time $T_5$, all signals have reached steady state and operation of the level shifting circuit can continue in the manner described for each transition of input signal 145.

Figure 5:
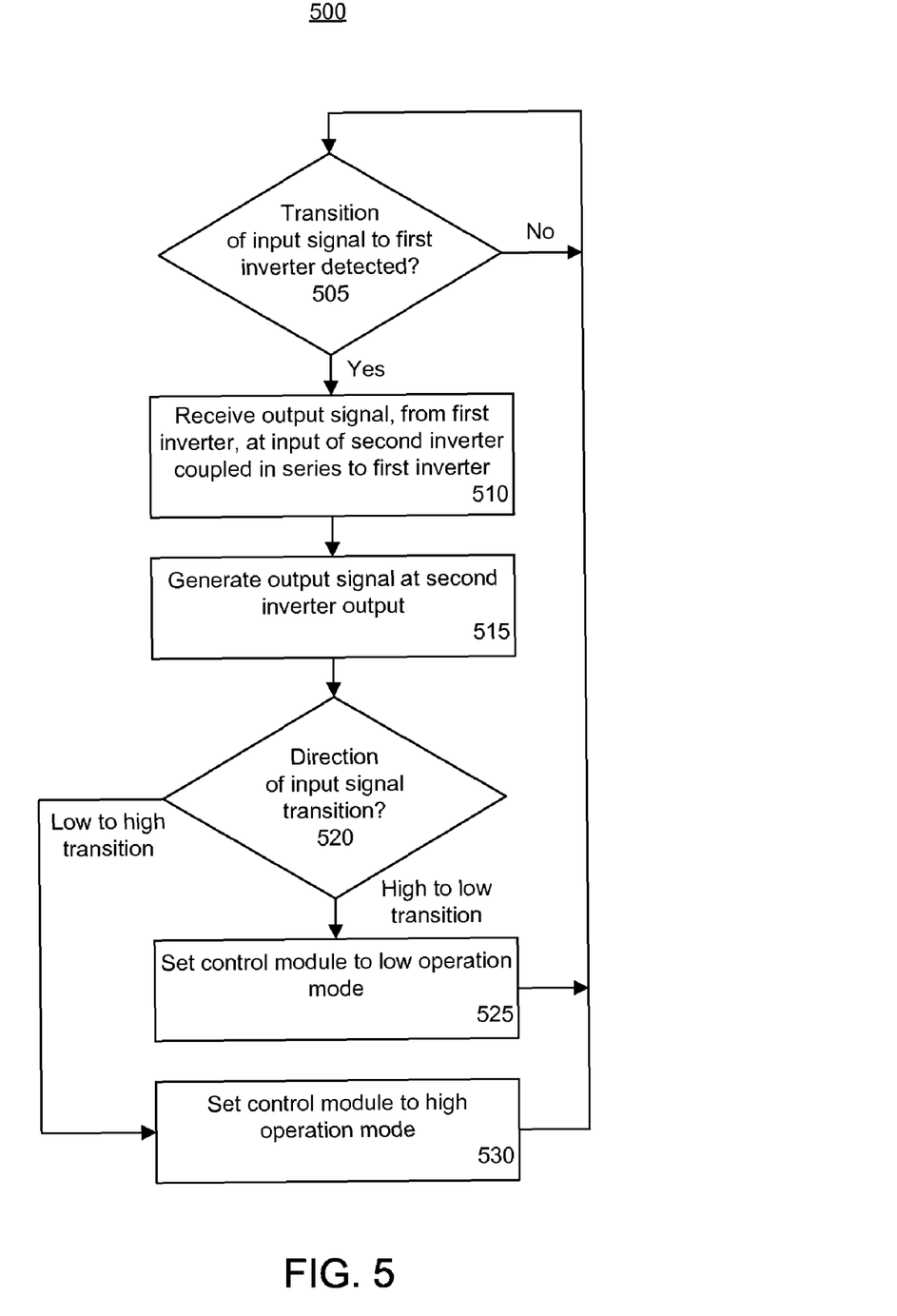
FIG. 5 is a flow chart illustrating a method of signal level shifting within an IC in accordance with another embodiment of the present invention.

FIG. 5 is a flow chart illustrating a method 500 of signal level shifting within an IC in accordance with another embodiment of the present invention. More particularly, method 500 describes a technique for shifting signal levels at an interface between two circuits operating at differing power supply voltage potentials and having differing signal levels. Method 500 can be implemented using a system such as the level shifting system described with reference to FIGS. 1-4 or any other system with the same or similar functionality.

Beginning at decision box 505, the system can monitor for a transition of an input signal, received by a first inverter. The first inverter can include a first pull-up device and an output. The input signal to the first inverter can have a voltage range that is less than the voltage range of a power supply powering the first inverter. More specifically, the voltage potential provided as a logic high by the input signal to the first inverter input does not disable the first pull-up device. In any case, the first inverter generates an output signal provided to the second inverter. When a transition of the input signal is detected, method 500 can proceed to step 510. When a transition of the input signal is not detected, method 500 can return step 505 and continue to monitor for a transition of the input signal.

In step 510, a second inverter can receive an output signal generated by the first inverter. The second inverter can include an input and an output. The input of the second inverter can be coupled to the output of the first inverter. In step 515, an output signal can be generated by the second inverter. The outputs of the first and second inverters can be used as control signals that specify an operation mode for a control module.

In decision box 520, the system can determine a direction of the transition of the input signal. When the transition of the input signal is from a logic high to a logic low, the method can proceed to step 525. When the transition of the input signal is from a logic low to a logic high, method 500 can proceed to step 530.

In step 525, the control module can be set to a low operation mode. In low operation mode, the input signal can be decoupled from the first pull-up device. In addition, the first pull-up device can be disabled and a positive feedback loop that latches an output state of the second inverter can be closed. The system can achieve steady state in low operation mode prior to a subsequent transition of the input signal from a logic low to a logic high. The decoupling of the input signal from the first pull-up device and the disabling of the first pull-up device can prevent the first pull-up device from being simultaneously enabled with a pull-down device in the first inverter during the transition of the input signal from a logic low to a logic high.

Decoupling the input signal from the first pull-up device can include opening a switch to decouple the input signal from a gate terminal of the first pull-up device, and coupling a power supply powering the first inverter to the gate terminal of the first pull-up device. Disabling the first pull-up device and latching an output state of the second inverter can include coupling the power supply to the first inverter output, and coupling the power supply to a gate terminal of the first pull-up device. At a time subsequent to a transition of the input signal from a logic high to a logic low, the system can reach steady state and method 500 can return to step 505.

In step 530, the control module can be set to a high operation mode. In high operation mode the input signal can be coupled to the first pull-up device, the first pull-up device can be enabled, and the feedback loop can be opened. In high operation mode, the first inverter can function as a conventional inverter. Coupling the input signal to the first pull-up device can include closing a switch to couple the input signal to a gate terminal of the first pull-up device, and decoupling the power supply powering the first inverter from the gate terminal of the first pull-up device. Enabling the first pull-up device and opening the feedback loop can include decoupling the power supply from the first inverter output and decoupling the power supply from a gate terminal of the first pull-up device. At a time subsequent to the transition of the input signal from a logic low to a logic high, the system can reach steady state and method 500 can return to step 505.

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A system for signal level shifting in an integrated circuit (IC), the system comprising:
    a first inverter comprising a first pull-up device and a pull-down device, wherein the first inverter is operable to receive an input signal having a voltage potential at a logic high that does not disable the first pull-up device;
    a second inverter coupled in series to an output of the first inverter; and
    a control module coupled to the output of the first inverter and an output of the second inverter, wherein, prior to the input signal transitioning to the logic high, the control module is operable to decouple the input signal from the first pull-up device, disable the first pull-up device, and close a feedback loop that latches an output state of the second inverter.

2. The system of claim 1, wherein the control module, responsive to a transition of the input signal from the logic low to the logic high, couples the input signal to the first pull-up device, enables the first pull-up device, and opens the feedback loop.

3. The system of claim 1, wherein the control module comprises:
    a third inverter, coupled to the output of the first inverter, that receives an output signal from the first inverter;
    a second pull-up device, coupled to the output of the first inverter, that receives the output signal from the first inverter; and
    a switch coupled to an output of the third inverter, that receives an output signal from the third inverter,
    wherein, responsive to the input signal to the first inverter transitioning to the logic low, the switch decouples the input signal from a gate terminal of the first pull-up device and the second pull-up device decouples the gate terminal of the first pull-up device from a power supply powering the system.

4. The system of claim 3, wherein, responsive to the input signal to the first inverter transitioning to the logic high, the switch couples the input signal to the first pull-up device, and the second pull-up device couples the gate terminal of the first pull-up device to the power supply.

5. The system of claim 3, wherein the switch comprises an N-type field effect transistor (NFET) device, comprising:
    a drain terminal coupled to the gate terminal of the first pull-up device;
    a source terminal that receives the input signal to the first inverter; and
    a gate terminal coupled to the output of the third inverter.

6. The system of claim 3, wherein the second pull-up device comprises a P-type field effect transistor (PFET) device, comprising:
    a source terminal coupled to the power supply;
    a drain terminal coupled to the gate terminal of the first pull-up device; and
    a gate terminal coupled to the output of the second inverter.

7. The system of claim 1, wherein the control module comprises:
    a second pull-up device, coupled to the output of the second inverter, that receives the output signal from the second inverter, wherein, responsive to the input signal to the first inverter transitioning to the logic low, the second pull-up device closes the feedback loop; and
    a third pull-up device, coupled to the output of the second inverter, that receives the output signal from the second inverter, wherein, responsive to the input signal to the first inverter transitioning to the logic low, the third pull-up device couples a gate terminal of the first pull-up device to a power supply powering the system.

8. The system of claim 7, wherein, responsive to the input signal to the first inverter transitioning to the logic high, the second pull-up device opens the feedback loop and the third pull-up device decouples the gate terminal of the first pull-up device from the power supply.

9. The system of claim 7, wherein the second pull-up device comprises a PFET device, comprising:
    a source terminal coupled to the power supply;
    a drain terminal coupled to the output of the first inverter; and
    a gate terminal coupled to the output of the second inverter.

10. The system of claim 7, wherein the third pull-up device comprises a PFET device, comprising:
    a source terminal coupled to the power supply;
    a drain terminal coupled to the gate terminal of the first pull-up device; and
    a gate terminal coupled to the output of the second inverter.

11. A system for signal level shifting in a complimentary metal oxide semiconductor (CMOS) integrated circuit (IC), the system comprising:
- a first inverter comprising an output, a first P-type field effect transistor (PFET) device and an N-type field effect transistor (NFET) device, wherein an input signal is coupled to the NFET device and selectively coupled to the first PFET device;
- a second inverter comprising an input and an output, wherein the input of the second inverter is coupled to the output of the first inverter; and
- a control module, coupled to the output of the first inverter and the output of the second inverter, wherein, prior to the input signal transitioning to a logic high, the control module decouples the input signal from the first PFET device, disables the first PFET device, and closes a feedback loop that latches an output state of the second inverter.

12. The system of claim 11, wherein the control module, responsive to a transition of the input signal from a logic low to the logic high, couples the input signal to the first PFET device, enables the first PFET device, and opens the feedback loop.

13. The system of claim 11, wherein the control module comprises:
- a third inverter comprising an input and an output, wherein the input of the third inverter is coupled to the output of the first inverter; and
- an NFET switch comprising:
  - a drain terminal coupled to a gate terminal of the first PFET device;
  - a source terminal coupled to receive the input signal; and
  - a gate terminal coupled to the output of the third inverter,
  - wherein, responsive to the input signal transitioning to a logic low, the NFET switch decouples the input signal from the gate terminal of the first PFET device.

14. The system of claim 11, wherein the control module comprises a second PFET device, the second PFET device comprising:
- a source terminal coupled to a power supply powering the system;
- a drain terminal coupled to a gate terminal of the first PFET device; and
- a gate terminal coupled to the output of the second inverter, wherein, responsive to the input signal transitioning to a logic low, the second PFET device decouples the gate terminal of the first PFET device from the power supply.

15. The system of claim 11, wherein the control module comprises a second PFET device, the second PFET device comprising:
- a source terminal coupled to a power supply powering the system;
- a drain terminal coupled to the output of the first inverter; and
- a gate terminal coupled to the output of the second inverter, wherein, responsive to the input signal transitioning to a logic low, the second PFET device couples the output of the first inverter to the power supply.

16. The system of claim 11, wherein the control module comprises a second PFET device, the second PFET device comprising:
- a source terminal coupled to a power supply powering the system;
- a drain terminal coupled to a gate terminal of the first PFET device; and
- a gate terminal coupled to the output of the second inverter, wherein, responsive to the input signal transitioning to a logic low, the second PFET device couples the gate terminal of the first PFET device to the power supply.

17. A method of signal level shifting in an integrated circuit (IC), the method comprising:
- detecting a transition of an input signal, received by a first inverter, from a logic high to a logic low, wherein the first inverter comprises a first pull-up device and an output;
- receiving, at a second inverter comprising an input and an output, an output signal generated by the first inverter, wherein the input of the second inverter is coupled to the output of the first inverter;
- generating an output signal at the output of the second inverter; and
- responsive to detecting the transition of the input signal from the logic high to the logic low, decoupling the input signal from the first pull-up device, disabling the first pull-up device, and latching an output state of the second inverter prior to a subsequent transition of the input signal to the logic high.

18. The method of claim 17, further comprising:
- detecting a transition of the input signal from the logic low to the logic high; and
- responsive to detecting the transition of the input signal from the logic low to the logic high, coupling the input signal to the first pull-up device, enabling the first pull-up device, and unlatching an output state of the second inverter.

19. The method of claim 17, wherein decoupling the input signal from the first pull-up device comprises:
- opening a switch that couples the input signal to a gate terminal of the first pull-up device; and
- enabling a second pull-up device that couples a power supply powering the first inverter to the gate terminal of the first pull-up device.

20. The method of claim 17, wherein disabling the first pull-up device and latching the output state of the second inverter comprises:
- enabling a second pull-up device, wherein the enabled second pull-up device couples a power supply powering the first and second inverters to the output of the first inverter; and
- enabling a third pull-up device, wherein the enabled third pull-up device couples the power supply to a gate terminal of the first pull-up device.

* * * * *